(12) United States Patent
Nakajima

(10) Patent No.: US 6,235,627 B1
(45) Date of Patent: *May 22, 2001

(54) SEMICONDUCTOR DEVICE AND METHOD FOR MANUFACTURING THE SAME

(75) Inventor: Kazuaki Nakajima, Tokyo (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 113 days.

(21) Appl. No.: 09/103,374

(22) Filed: Jun. 24, 1998

(30) Foreign Application Priority Data

Jun. 30, 1997 (JP) .................................... 9-174501
Jun. 4, 1998 (JP) .................................... 10-155952

(51) Int. Cl.$^7$ .................................................. H01L 21/44
(52) U.S. Cl. .......................... 438/638; 438/649; 438/655; 438/666; 438/785; 257/750; 257/754; 257/768; 257/770

(58) Field of Search ..................................... 438/683, 785, 438/649, 655, 666; 257/750, 754, 768, 770

(56) References Cited

FOREIGN PATENT DOCUMENTS 8-264531  10/1996 (JP) .

*Primary Examiner*—David Nelms
*Assistant Examiner*—Reneé R Berry
(74) *Attorney, Agent, or Firm*—Finnegan, Henderson, Farabow, Garrett, & Dunner, L.L.P.

(57) ABSTRACT

A semiconductor device is formed by forming a groove portion whose side surface is formed of a first insulating film and whose bottom surface is formed of a silicon film on the main surface of a semiconductor substrate, forming a metal film on the silicon film of a bottom portion of the groove portion, reacting the silicon film with the metal film by a heat treatment to selectively form a silicide film on the bottom portion of the groove portion, removing the metal film other than a portion thereof which has been converted to metal silicide after the metal silicide layer is formed, and forming a second insulating film on the metal silicide film to form one of a wiring and an electrode which is covered with the first and second insulating films.

17 Claims, 6 Drawing Sheets

SEMICONDUCTOR DEVICE AND METHOD FOR MANUFACTURING THE SAME

BACKGROUND OF THE INVENTION

This invention relates to a semiconductor device and a method for manufacturing the same, and more particularly to a semiconductor device having wirings or electrodes of metal silicide and a method for manufacturing the same.

Recently, the requirements for the high integration density and high speed operation of semiconductor devices are increased. In order to meet the requirements, the distance between elements and the element size are reduced and studies for lowering the resistance of internal wiring materials are made.

A lowering in the resistance is a serious subject in the word line of a memory device in which the RC delay significantly appears. Therefore, recently, in order to reduce the resistance of the word line, a polycide gate formed of a 2-layered structure having a polysilicon film and a metal silicide film is widely used. Since the resistance of a refractory metal silicide film is lower than that of the polysilicon film by approximately one order of magnitude, the refractory metal silicide film may be desirably used as a material of a low resistance wiring. As silicide, tungsten silicide ($WSi_x$) is most widely used.

However, in order to cope with a fine wiring of 0.15 μm or less, it is required to further lower the resistance of the wiring so as to reduce the delay time. In order to realize the gate electrode having a low resistance of 1 Ω/square or less by use of the polycide structure, silicide with a lower specific resistance is required.

As the low-resistance metal silicide, silicide of such as cobalt (Co) and nickel (Ni) is provided. However, since the halide of the above metals is low in the vapor pressure, it is extremely difficult to form the gate electrode by dry etching.

Therefore, when the above low-resistance metal silicide is used, the SALICIDE (Self Aligned Silicidation) technique is generally used. The technique is to deposit metal such as Co on the gate electrode and the source and drain regions and subject them to the heat treatment so as to selectively form silicide only on portions in which silicon is exposed. When the above technique is used, it is not necessary to subject the metal silicide to dry etching and it is possible to simultaneously form a silicide layer on the gate electrode and the source and drain regions.

On the other hand, with the progress of the miniaturization and high integration density, the requirement for the alignment precision of the exposure device becomes strict. Particularly, in a semiconductor memory as is represented by a DRAM, the integration density is high and the precision of alignment between the gate electrode and the contacts of the source or drain region is extremely severe.

Therefore, in order to solve the above problem, in the DRAM manufacturing process, the Self Aligned Contact (SAC) technique is used. The SAC technique is to surround the gate electrode with a silicon nitride film or the like and then form a contact hole by use of the high selectivity etching technique for a silicon oxide film against a silicon nitride film. By the SAC technique, even if the position of the contact is slightly deviated to the gate electrode side, the silicon nitride film is always present between the gate electrode and the contact, thereby preventing occurrence of an electrical short therebetween. Thus, the margin for the misalignment of the contact can be enhanced.

However, when the gate electrode is formed by use of the SALICIDE technique, it is impossible to previously cover the upper portion of the gate electrode with an insulating film for the sake of a step of forming metal silicide on the upper portion of the gate electrode. If the metal silicide is previously formed on the upper portion of the gate electrode and then an insulating film is formed on the metal silicide, formation of the contact hole cannot be effected in a self-alignment manner. That is, the SALICIDE technique and the Self Aligned Contact technique are incompatible. Therefore, it is extremely difficult to use the SALICIDE technique for a semiconductor device of high integration density such as a memory.

Moreover, if the low-resistance metal silicide of cobalt, nickel or the like is used for the gate electrode, it is extremely difficult to dry-etch the same into a desired shape. Therefore, it is considered to use the SALICIDE technique, but in this case, since it is incompatible with the Self Aligned Contact technique, it becomes extremely difficult to use the technique for the semiconductor device of high integration density.

BRIEF SUMMARY OF THE INVENTION

An object of this invention is to provide a semiconductor device in which a metal silicide material which is difficult to be subjected to dry etching can be used for the gate electrode, and at the same time, the Self Aligned Contact technique can be used and a method for manufacturing the same.

In order to attain the above object, a method for manufacturing a semiconductor device according to a first aspect of this invention comprises the steps of forming a groove portion whose side surface is formed of a first insulating film and whose bottom surface is formed of a silicon film on a main surface of a semiconductor substrate; forming a metal film on the silicon film of a bottom portion of the groove portion; reacting the silicon film and the metal film by a heat treatment to selectively form a metal silicide layer on the bottom portion of the groove portion; removing the metal film other than a portion thereof which has been converted to the metal silicide layer after the step of reacting the silicon film and the metal film; and forming a second insulating film on the metal silicide layer to form one of a wiring and an electrode which is covered with the first and the second insulating film.

A method for manufacturing a semiconductor device according to a second aspect of this invention comprises the steps of forming a groove portion whose side surface is formed of a first insulating film and whose bottom surface is formed of a silicon film and a third insulating film lying around the first insulating film on a main surface of a semiconductor substrate on which a gate insulating film is formed; forming a first metal film on the silicon film of the bottom portion of the groove portion; reacting the silicon film and the first metal film by a heat treatment to selectively form a first metal silicide layer on the bottom portion of the groove portion; removing the first metal film other than a portion which has been converted to the first metal silicide layer after the step of reacting the silicon film and the first metal film; forming a second insulating film on the first metal silicide layer to form one of a wiring and an electrode which is covered with the first and the second insulating film; forming a contact hole in the third insulating film in self-alignment with the first and the second insulating film; and filling a conductive material in the contact hole.

The step of forming the groove portion and the third insulating film may include the steps of forming the silicon film on the main surface of the semiconductor substrate on which a gate insulating film is formed; processing the silicon film into a desired pattern; forming the first insulating film on a side surface of the silicon film which has been processed into the desired pattern; forming the third insulating film on an entire portion of the main surface of the semiconductor substrate; making the third insulating film flat until an upper surface of the silicon film is exposed; and removing the silicon film by a preset thickness to form the groove portion surrounded by the first insulating film.

It is preferable to further include a step of making the silicon film flat between the step of forming the silicon film and the step of processing the silicon film into the desired pattern.

The step of forming the groove portion and the third insulating film may include the steps of forming the silicon film on the main surface of the semiconductor substrate on which a gate insulating film is formed; forming a dummy film on the silicon film; processing the silicon film and the dummy film into a desired pattern; forming the first insulating film on side surfaces of the silicon film and the dummy film which have been processed into the desired pattern; forming the third insulating film on the main surface of the semiconductor substrate; making the third insulating film flat until an upper surface of the dummy film is exposed; and removing the dummy film to form the groove portion surrounded by the first insulating film.

It is preferable to further include a step of making the silicon film flat between the step of forming the silicon film and the step of forming the dummy film.

The step of forming the groove portion and the third insulating film may include the steps of forming a laminated layer which is formed by sequentially laminating the silicon film, a fourth insulating film, a dummy film and a fifth insulating film on the main surface of the semiconductor substrate on which the gate insulating film is formed; processing the laminated layer into a desired pattern to form a laminated gate electrode layer; forming a pair of a source and a drain region on the surface of the semiconductor substrate on both sides of the laminated gate electrode layer; forming a sixth insulating film on a side surface of the laminated gate electrode layer; removing portions of the gate insulating film which lie on the source and the drain region and forming second metal films on exposed portions of the source and the drain region; reacting the source and the drain region with the second metal films by a heat treatment to form second silicide layers on surfaces of the source and the drain region; removing the second metal film other than a portion which has been converted to the second metal silicide layer after the step of forming the second metal silicide layer; forming third insulating film on an entire surface of the semiconductor substrate; making the third, the second and the first insulating film flat until an upper surface of the dummy film is exposed; and removing the dummy film.

The contact hole is formed on one of the source and the drain region and the conductive material filling the contact hole is connected to the second metal silicide layer.

According to this invention, since it is not necessary to pattern the metal silicide by dry etching, low-resistance metal silicide which is difficult to be used in the prior art can be used for forming gate wirings, gate electrodes or the like, and since the surrounding portion of the wiring or electrode is covered with an insulating film, the self aligned contact technique can be used.

Therefore, this invention is particularly effective when a metal silicide, which is difficult to be used for dry etching, is used. Generally, gas containing halogen elements is used for dry etching, and therefore, this invention is effective when a metal silicide containing a metal whose halide has a low vapor pressure is used.

From the above viewpoint, it is preferable to form the metal film of at least one metal whose halide has a melting point or sublimation point of 300° C. or more.

Further, it is preferable that the metal film is formed of at least one metal selected from a group consisting of cobalt (Co), chrome (Cr), nickel (Ni), magnesium (Mg), hafnium (Hf), rhodium (Rh), palladium (Pd), platinum (Pt), vanadium (V) and zirconium (Zr).

However, the manufacturing method of this invention is not limited to the above metals and, for example, a metal such as titanium (Ti) whose halide has a low melting point or sublimation point can be used.

For example, a silicon nitride film can be used for the first and second insulating films and a silicon oxide film can be used for the third insulating film.

Further, according to the above manufacturing method, since metal silicide which is difficult to be dry-etched can be used for formation of gate wirings or gate electrodes and the Self Aligned Contact technique can be used, the following semiconductor device can be formed.

A semiconductor device according to a third aspect of this invention comprises a semiconductor substrate; one of a wiring and an electrode which is formed on the semiconductor substrate and formed of silicon and metal silicide formed on the silicon; an insulating film formed to cover a side surface and an upper surface of one of the wiring and the electrode; and a conductive material for contact formed along part of the insulating film from an upper end of the insulating film to a surface of the semiconductor substrate; wherein the metal silicide includes at least one metal whose halide has a melting point or sublimation point of 300° C. or more.

Further, it is preferable that the metal silicide contains at least one metal selected from a group consisting of cobalt (Co), chrome (Cr), nickel (Ni), magnesium (Mg), hafnium (Hf), rhodium (Rh), palladium (Pd), platinum (Pt), vanadium (V) and zirconium (Zr).

The conductive material for contact has a larger plane size on an upper end of the insulating film than that on the surface of the semiconductor substrate.

The inventors of this application filed a patent application for a method of filling a metal film in a groove (Jpn. Pat. Appln. KOKAI 8-264531). The method is to form a metal film on the entire surface after a groove is formed and make the metal film flat to attain a structure in which the metal film is filled in the groove.

However, in the step of making the metal film flat, a variation in the planarization process may directly cause a variation in the film thickness of the metal film. For example, in a method for making the metal film flat by a CMP (Chemical-Mechanical Polishing) method, the film thickness of the metal film filled in the groove and the depth of the groove depend on the pattern by an effect of reducing the film thickness of the metal film filled in the groove in a wide pattern (dishing), or an effect of removing not only the filled metal but also part of the groove in a portion where the pattern becomes continuous for the line and space (thinning).

Further, a method for making the metal film flat by etching back the metal film by dry etching, for example, is known. However, a so-called loading effect that the etching speed is changed depending on the opening size occurs and the remaining portion (residue) of the metal film depends on the pattern width or the like.

Since a variation in the film thickness of the metal film directly reflects on a variation in the resistance of the gate electrode, a fluctuation in the element characteristic of a semiconductor element will be increased if the semiconductor element is formed by use of the above planarization technique.

According to this invention, a metal silicide layer can be formed on the bottom portion of a groove which is opened in a self-alignment manner and the planarization step for the silicide layer is not necessary.

Further, when a metal contact is formed after a step of covering the upper layer and side wall of the silicide with the same insulating film, in order to cope with the Self Aligned Contact (SAC) technique, this invention can be effectively used.

That is, in a method of filling the metal film in the groove, for example, a step of lowering the metal film from the upper end of the groove by use of the dry etching method, that is, a recess step becomes necessary. However, the technique for controlling the etching amount of the metal film at a desired depth is extremely difficult, and the un-uniformity of the etching speed in the plane gives a large influence on the remaining film of the metal film in addition to the loading effect described before.

On the other hand, in a method of forming the silicide layer in a self-alignment manner, since the silicide layer is formed to creep into the silicon layer on the bottom portion of the groove, the upper end of the silicide layer can be set lower than the upper end of the groove by controlling the film thickness of the metal film to be formed. That is, the SAC structure can be formed without using the recess step.

As described above, the step which increases a variation in the low-resistance layer of the gate electrode can be omitted and the element characteristic can be enhanced by using the method of forming the silicide layer in the groove in a self-alignment manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described embodiments of this invention with reference to the accompanying drawings.

(First Embodiment)

FIGS. 1A to 1J are cross sectional views for illustrating the steps of a method for forming a gate electrode pattern of a MOS electric field transistor according to a first embodiment of this invention.

Figure 1A:
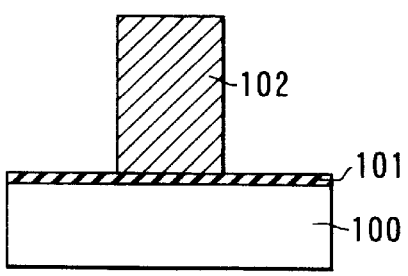
FIGS. 1A to 1J are cross sectional views taken along the gate length direction of a transistor, for illustrating a manufacturing method in the order of the steps for manufacturing a semiconductor device according to a first embodiment of this invention.

First, as shown in FIG. 1A, a thin oxide film (film thickness : 5 nm) 101 is formed as a gate insulating film on a semiconductor substrate 100 formed of single crystal silicon and a polysilicon film (film thickness 200 nm) 102 is deposited thereon by use of the chemical vapor deposition (CVD) method. After this, $P^+$ ions are doped into the polysilicon film in a condition that the acceration voltage is 10 keV and the dose is $5 \times 10^{15}$ $cm^{-2}$ and then a heat treatment is performed at a temperature of 800° C. for 30 minutes in a nitrogen atmosphere, for example. After this, a photoresist (film thickness : 1 $\mu$m) is coated on the polysilicon film 102 by the spin coating method and the photoresist is exposed by use of a photomask and developed to form a resist pattern of 0.15 $\mu$m width, for example.

Then, the polysilicon film 102 is etched along the resist pattern by use of a dry etching device. The remaining resist pattern is separated by $O_2$ ashing after the etching process of the polysilicon film 102.

Figure 1F:
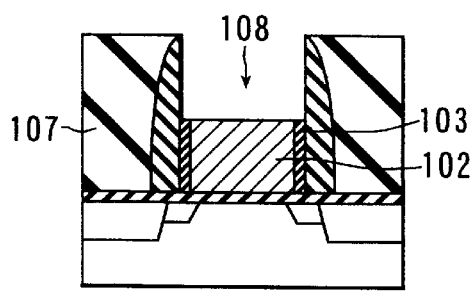
Figure 1B:
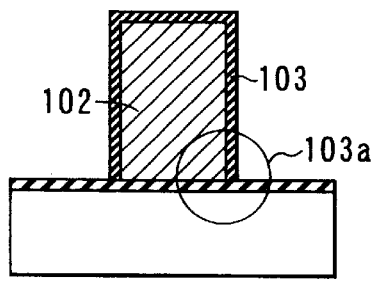

Next, as shown in FIG. 1B, a post oxidation step is effected for recovering the thin silicon oxide film 101 which is partly removed at the time of etching of the polysilicon film 102 and rounding a corner portion 103a of the polysilicon film 102 and thus an oxide film 103 is formed. Thus, the gate oxide film 101 is recovered to the original film thickness and the corner portion 103a of the polysilicon film 102 is rounded. As a result, concentration of the electric field in the corner portion 103a of the gate electrode can be prevented and the reliability of the gate oxide film 101 is enhanced. The post oxidation step is effected to further enhance the reliability of the device and is not necessarily effected for all of the devices.

Figure 1G:
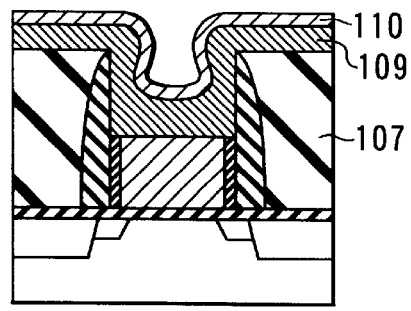
Figure 1C:
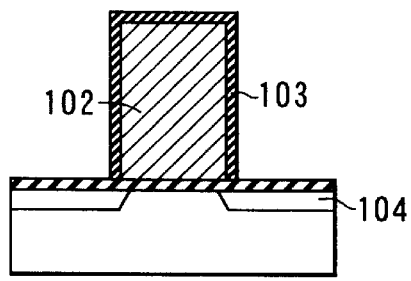

Next, as shown in FIG. 1C, for example, $As^+$ ions are doped into the substrate by the ion-implantation technique in a condition that the acceleration voltage is 30 keV and the dose amount is $3 \times 10^{14}$ $cm^{-2}$ and then the heat treatment is effected at a temperature of 900° C. for approximately 30 seconds in a nitrogen atmosphere, for example, so as to form N-type doped layers (source/drain regions) 104.

Figure 1H:
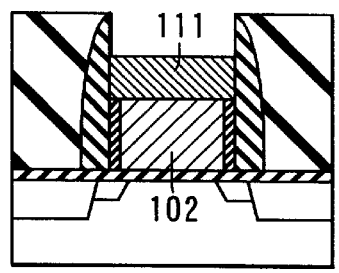
Figure 1D:
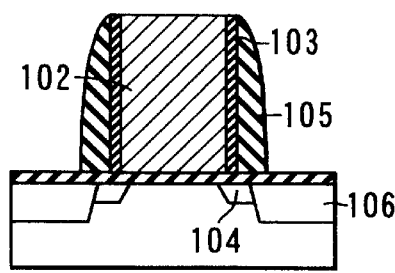

Then, as shown in FIG. 1D, a silicon nitride film (film thickness : 25 nm) 105 is deposited by the CVD method and etched back by the dry etching method so that the silicon nitride film 105 will be left behind only on the side wall of the polysilicon film 102. After this, for example, As⁺ ions are doped into the substrate by the ion-implantation technique in a condition that the acceleration voltage is 45 keV and the dose is $3 \times 10^{15}$ cm$^{-2}$ and then the heat treatment is effected at a temperature of 800° C. for approximately 30 minutes in a nitrogen atmosphere, for example, so as to form N⁺ doped layers (source/drain regions) 106.

Figure 1I:
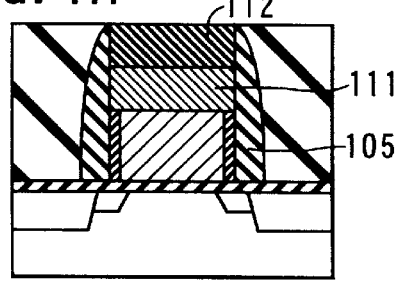
Figure 1E:
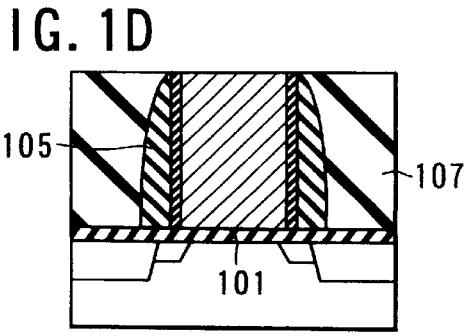

Next, as shown in FIG. 1E, a silicon oxide film (film thickness : 400 nm) 107 is deposited by the CVD method and is made flat by, for example, the chemical-mechanical polishing (CMP) method until the upper surface of the polysilicon film 102 appears.

Next, as shown in FIG. 1F, the surface of the polysilicon film 102 is lowered from the surface of the silicon oxide film 107 by approximately 100 nm by dry etching. As a result, a groove 108 whose side surface is formed of the silicon nitride film 105 and whose bottom surface is formed of the polysilicon film 102 is formed.

Next, as shown in FIG. 1G, a cobalt film (film thickness : 10 nm) 109 is deposited as a metal film on the entire surface by the sputtering method and, for example, a titanium nitride film (film thickness 20 nm) 110 is formed as an antioxidant film on the cobalt film in order to prevent oxidation of the cobalt film 109 by remaining oxygen contained in the heating atmosphere. If the partial pressure ratio of the remaining oxygen can be sufficiently lowered at the time of the heat treatment, the antioxidant film is not necessarily formed.

Next, as shown in FIG. 1H, for example, the heat treatment is effected at a temperature of 600° C. for 60 seconds to react the cobalt film 109 with the polysilicon film 102 so as to form a cobalt silicide layer (film thickness : 35 nm) 111 on the bottom portion of the groove. Then, for example, the cobalt film 109 and titanium nitride film 110 are selectively removed with the selective ratio with respect to the silicide layer 111 by use of a mixture of sulfuric acid and hydrogen peroxide solution and then the heat treatment is effected at a temperature of 850° C. for approximately 30 seconds, for example.

Next, as shown in FIG. 1I, a silicon nitride film 112 is deposited by the CVD method and is made flat by use of the CMP method, for example, until it reaches the height of the surface of the silicon oxide film 107. As a result, a gate electrode pattern formed of a laminated film of the cobalt silicide film 111 and polysilicon film 102 whose upper and side surfaces are surrounded by the silicon nitride films 112 and 105 is formed.

Figure 1J:
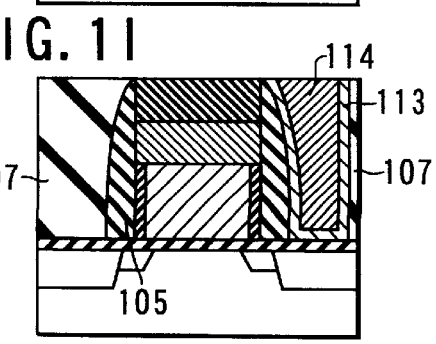

Next, as shown in FIG. 1J, a contact hole is formed by use of the etching technique of high selectivity for silicon oxide film against silicon nitride film. Then, by the sputtering method, a laminated film 113 formed of a titanium film (10 nm) and titanium nitride film (10 nm) is deposited and then a tungsten film 114 is formed by the CVD method. After this, the laminated film 113 formed of the titanium film and titanium nitride film and the tungsten film 114 are polished and made flat to the surface of the silicon oxide film 107 by use of the CMP method, for example.

At this time, since the silicon nitride films 105 and 112 remain between the gate electrode and the contact, the gate electrode will not be electrically shorted with the contact even if the position of the contact hole pattern is slightly deviated to the gate electrode side. In this case, as shown in FIG. 1J, the contact is formed with a surface configuration corresponding to the surface configuration of the silicon nitride film.

As described above, by using this invention, metal silicide which cannot be etched can be used and the Self Aligned Contact technique can be used. Therefore, a low-resistance gate electrode which can be used for a device of high integration density such as a memory can be provided.

In this embodiment, the impurity doping to the polysilicon film is performed by ion implantation after the polysilicon film formation. Instead, a previously doped polysilicon film may be used. Further, after the metal silicide layer formation, the impurity doping may be performed through the metal silicide layer into the polysilicon film.

(Second Embodiment)

Next, a second embodiment of this invention is explained with reference to FIGS. 2A to 2I. FIGS. 2A to 2I are cross sectional views for illustrating the steps of a method for forming a gate electrode pattern of a MOS electric field transistor.

Figure 2A:
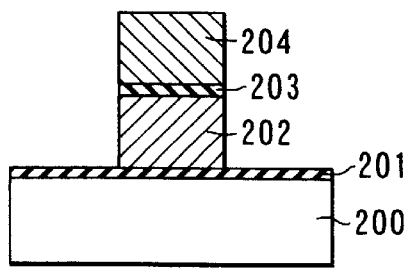
FIGS. 2A to 2I are cross sectional views taken along the gate length direction of a transistor, for illustrating a manufacturing method in the order of the steps for manufacturing a semiconductor device according to a second embodiment of this invention.

First, as shown in FIG. 2A, a thin oxide film (film thickness 5 nm) 201 is formed as a gate insulating film on a semiconductor substrate 200 formed of single crystal silicon and a polysilicon film (film thickness : 100 nm) 202 is deposited thereon by use of the CVD method. After this, P⁺ ions are doped into the polysilicon film in a condition that the acceration voltage is 10 keV and the dose is $5 \times 10^{15}$ cm$^{-2}$ and then a heat treatment is performed at a temperature of 800° C. for 30 minutes in a nitrogen atmosphere, for example. Further, for example, a silicon oxide film (film thickness : 10 nm) 203 and a polysilicon film (film thickness : 100 nm) 204 are formed on the polysilicon film 202 as a dummy layer to be removed in the groove forming stage.

After this, a photoresist (film thickness : 1 μm) is coated on the polysilicon film 204 by the spin coating method and the photoresist is exposed by use of a photomask and developed to form a resist pattern of 0.15 μm width, for example.

Then, the polysilicon film 204, silicon oxide film 203 and polysilicon film 202 are etched along the resist pattern by use of a dry etching device. The remaining resist pattern is separated by O₂ ashing after the etching process.

Figure 2F:
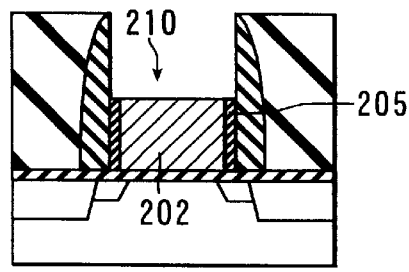
Figure 2B:
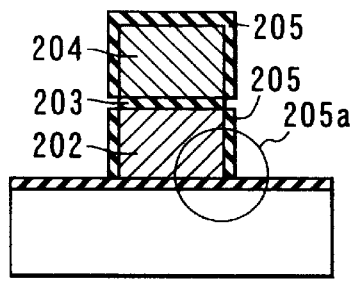

Next, as shown in FIG. 2B, a post oxidation step is effected for recovering the thin silicon oxide film 201 which is partly removed at the time of etching and rounding a corner portion 205a of the polysilicon film 202 and thus an oxide film 205 is formed. Thus, the gate oxide film 201 is recovered to the original film thickness and the corner portion 205a of the polysilicon film 202 is rounded.

As a result, concentration of the electric field in the corner portion 205a of the gate electrode can be prevented and the reliability of the gate oxide film 201 is enhanced. The post oxidation step is effected to further enhance the reliability of the device and is not necessarily effected for all of the devices.

Figure 2G:
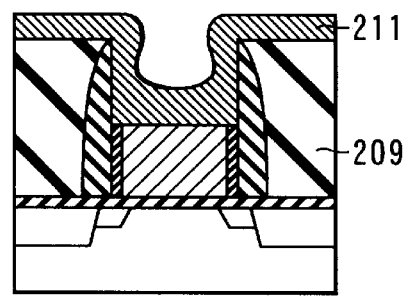
Figure 2C:
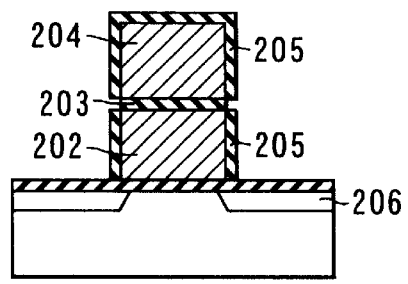

Next, as shown in FIG. 2C, for example, As⁺ ions are doped into the substrate by the ion-implantation technique in a condition that the acceleration voltage is 30 keV and the dose is $3 \times 10^{14}$ cm$^{-2}$ and then the heat treatment is effected at a temperature of 900° C. for approximately 30 seconds in a nitrogen atmosphere, for example, so as to form N-type doped layers (source/drain regions) 206.

Figure 2H:
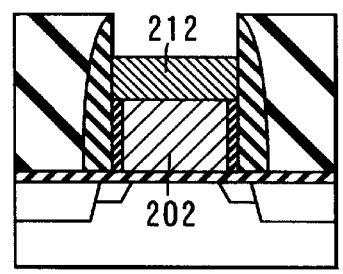
Figure 2D:
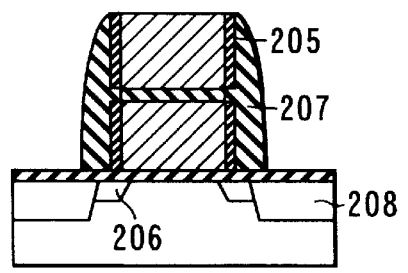

Then, as shown in FIG. 2D, a silicon nitride film (film thickness : 25 nm) 207 is deposited by the CVD method and etched back by the dry etching method so that the silicon nitride film 207 will be left behind only on the side walls of the polysilicon film 202, silicon oxide film 203 and polysilicon film 204.

After this, for example, As⁺ ions are doped into the substrate by the ion-implantation technique in a condition that the acceleration voltage is 45 keV and the dose is $3 \times 10^{15}$ cm$^{-2}$ and then the heat treatment is effected at a temperature of 800° C. for approximately 30 minutes in a nitrogen atmosphere, for example, so as to form N⁺ doped layers (source/drain regions) 208.

Figure 2E:
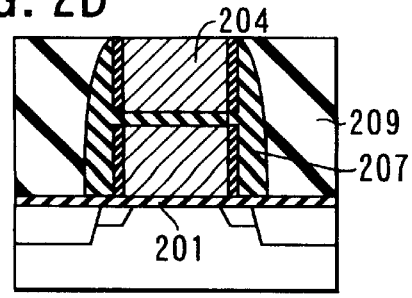

Next, as shown in FIG. 2E, a silicon oxide film (film thickness : 400 nm) 209 is deposited by the CVD method so as to fill a space between the gate electrodes and is made flat by use of, for example, the CMP method until the upper surface of the polysilicon film 204 appears.

Next, as shown in FIG. 2F, the polysilicon film 204 and silicon oxide film 203 which are the dummy layer are removed. More specifically, the polysilicon film 204 is first removed by dry etching. Since the etching selectivity of the polysilicon film against silicon oxide film is 100 or more, only the polysilicon film 204 can be removed with high controllability.

After this, the silicon oxide film 203 is removed by use of a diluted hydrofluoric acid solution. The method for removing the silicon oxide film 203 may be the dry etching method. As a result, a groove 210 whose side surface is formed of the silicon nitride film 207 and whose bottom surface is formed of the polysilicon film 202 is formed.

Next, as shown in FIG. 2G, for example, a nickel film (film thickness : 10 nm) 211 is deposited as a metal film on the entire surface by the sputtering method.

Next, as shown in FIG. 2H, for example, the heat treatment is effected at a temperature of 600° C. for 60 seconds to react the nickel film 211 with the polysilicon film 202 so as to form a nickel silicide layer 212 on the bottom portion of the groove. Then, for example, the non-reacted nickel film is selectively removed from the silicide layer by use of a mixture of sulfuric acid and hydrogen peroxide solution.

Figure 2I:
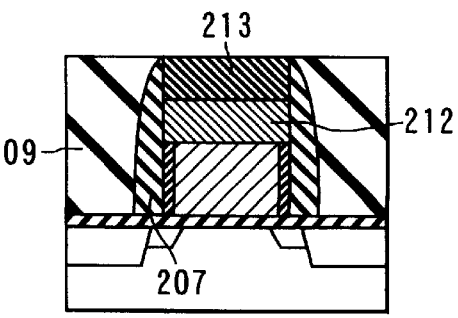

Next, as shown in FIG. 2I, a silicon nitride film 213 is deposited by the CVD method and is made flat until the upper surface thereof reaches the surface of the silicon oxide film 209 by use of the CMP method, for example. As a result, a structure in which the upper and side surfaces of the nickel silicide layer 212 are covered with the silicon nitride films 213 and 207 is obtained and a gate electrode pattern formed of a laminated film of the nickel silicide layer 212 and polysilicon film 202 is formed.

After this, if a contact hole is formed by the Self Aligned Contact technique like the first embodiment, the gate electrode will not be electrically shorted with the contact even if the position of the contact hole pattern is slightly deviated since the silicon nitride films 207 and 213 remain between the gate electrode and the contact.

In this embodiment, the laminated film of the polysilicon film and the silicon oxide film is used as the dummy layer which is removed in the groove forming stage, but any material can be used if it can be selectively removed with respect to an insulating film (in this embodiment, silicon nitride film) formed on the side wall of the groove and an insulating film (in this embodiment, silicon oxide film) which fills the space between the gate electrodes.

For example, among the same type of silicon oxide films, materials obtained by intentionally doping impurities into silicon oxide films such as SiOF, BSG (boron silicate glass), BPSG (boron-doped phosphosilicate glass), PSG (phosphosilicate glass) and coating type organic SOG (spin-on-glass) have the selectivity with respect to the normal silicon oxide film and they can be used as a dummy layer.

If the device does not require a post oxidation step, a metal which can be separated by use of a mixture of sulfuric acid and hydrogen peroxide solution may be used. For example, a tungsten film, molybdenum film, tantalum film, aluminum film, titanium film, or an alloy thereof or a laminated film thereof can be used as a dummy layer.

Further, as the method for removing the dummy layer, the reactive ion etching method is used in the above example, a chemical dry etching method, vapor-phase etching method, wet etching method or a combination thereof may be used.

Further, in this embodiment, an antioxidant film for preventing oxidation by the remaining oxygen contained in the heating atmosphere is not used, but it may be used if required.

(Third Embodiment)

Next, a third embodiment of this invention is explained with reference to FIGS. 3A to 3J and FIGS. 4A to 4J. The figures are cross sectional views for illustrating the manufacturing method in the order of the steps for forming a gate electrode pattern of a MOS field effect transistor. FIGS. 3A to 3J show the cross sections in the lengthwise direction of the gate electrode of the transistor and FIGS. 4A to 4J show the cross sections in the width direction of the gate electrode of the transistor.

Figure 3A:
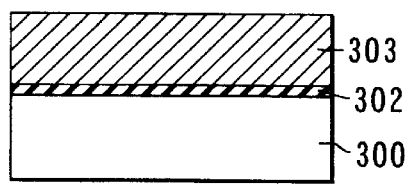
FIGS. 3A to 3J are cross sectional views taken along the gate length direction of a transistor, for illustrating a manufacturing method in the order of the steps for manufacturing a semiconductor device according to a third embodiment of this invention.
Figure 4A:
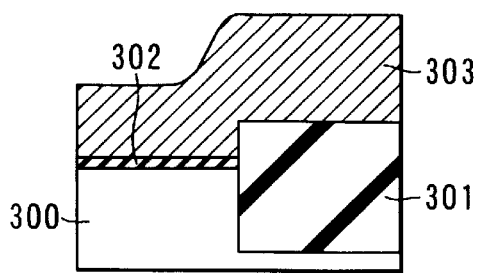
FIGS. 4A to 4J are cross sectional views taken along the gate width direction of a transistor, for illustrating the manufacturing method in the order of the steps for manufacturing a semiconductor device according to the third embodiment of this invention.

First, as shown in FIGS. 3A, 4A, a thin oxide film (film thickness : 5 nm) 302 is formed as a gate insulating film on a semiconductor substrate 300 having an element isolation region 301 formed thereon and a polysilicon film (film thickness : 100 nm) 303 is deposited thereon by use of the CVD method. After this, P⁺ ions are doped into the polysilicon film in a condition that the acceration voltage is 10 keV and the dose is $5 \times 10^{15}$ cm$^{-2}$ and then a heat treatment is performed at a temperature of 800° C. for 30 minutes in a nitrogen atmosphere, for example.

Figure 3B:
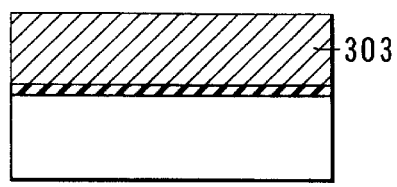
Figure 4F:
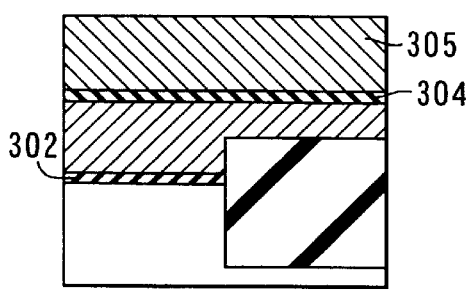
Figure 4B:
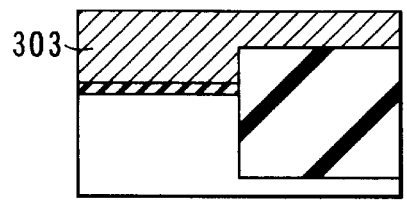

Next, as shown in FIGS. 3B, 4B, the polysilicon film 303 is polished and made flat by the CMP method by an amount corresponding to a portion of the element isolation region 301 which projects from the semiconductor substrate 300. As the method for making the polysilicon film 303 flat, the etch-back method can be used instead of the CMP method.

Figure 3C:
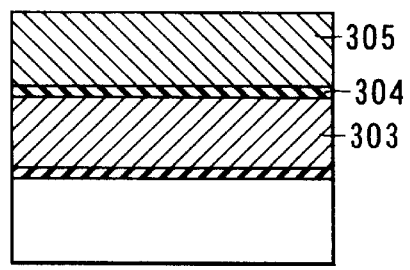
Figure 4G:
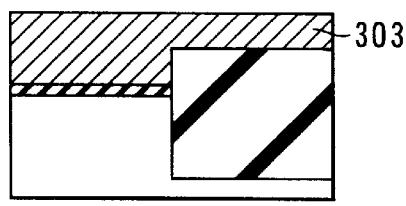
Figure 4C:
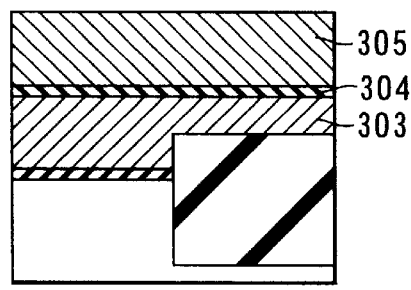

Next, as shown in FIGS. 3C, 4C, for example, a silicon oxide film (film thickness : 10 nm) 304 and a polysilicon film (film thickness : 100 nm) 305 are sequentially formed on the polysilicon film 303 as a dummy layer to be removed in the groove forming stage.

Figure 3D:
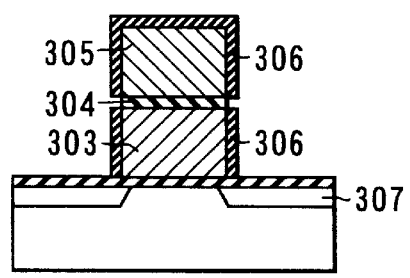
Figure 4H:
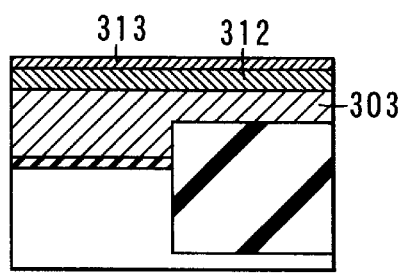
Figure 4D:
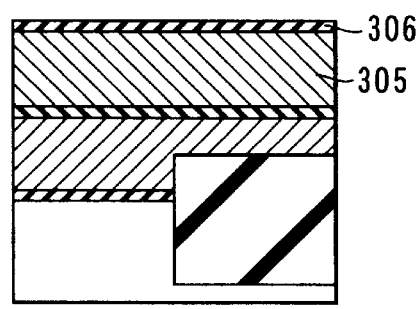

After this, a resist pattern (not shown) is formed on the polysilicon film 305 and then the polysilicon film 305, silicon oxide film 304 and polysilicon film 303 are etched along the resist pattern by use of a dry etching device as shown in FIGS. 3D, 4D. The remaining resist pattern is separated by O₂ ashing after the etching process.

After this, a post oxidation step is effected for recovering the thin oxide film 302 which is partly removed at the time of etching and rounding a corner portion of the polysilicon film and thus an oxide film 306 is formed. The post oxidation step is effected to further enhance the reliability of the device and is not necessarily effected for all of the devices.

Next, for example, As⁺ ions are doped into the substrate by the ion-implantation technique in a condition that the acceleration voltage is 30 keV and the dose is $3 \times 10^{14}$ cm$^{-2}$ so as to form N-type doped layers (source/drain regions) 307.

Figure 3E:
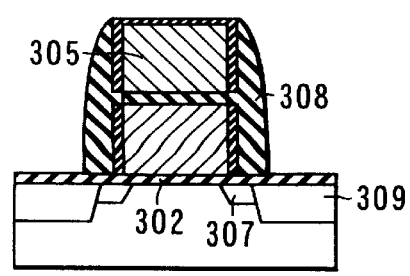
Figure 4I:
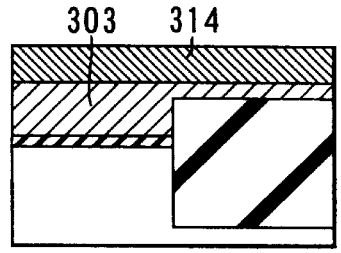
Figure 4E:
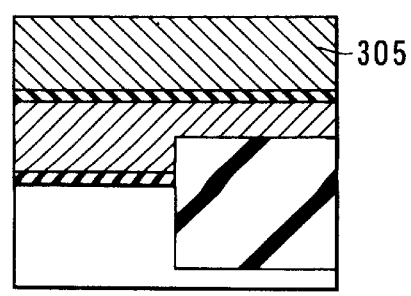

Then, a silicon nitride film (film thickness 25 nm) 308 is deposited on the entire surface by the CVD method, and as shown in FIGS. 3E, 4E, the silicon nitride film is etched back by the dry etching method so that the silicon nitride film will be left behind only on the side walls of the polysilicon film 303, silicon oxide film 304 and polysilicon film 305. Further, for example, As$^+$ ions are doped into the substrate by the ion-implantation technique in a condition that the acceleration voltage is 45. keV and the dose is $3\times10^{15}$ cm$^{-2}$ so as to form N$^+$ doped layers (source/drain regions) 309.

Figure 3F:
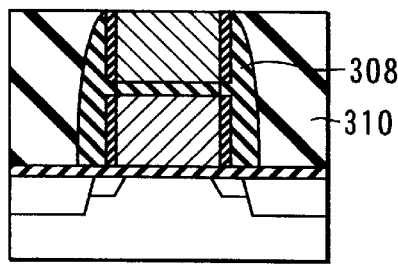

Next, as shown in FIGS. 3F, 4F, a silicon oxide film (film thickness : 400 nm) 310 is deposited by the CVD method and is made flat until the upper surface of the polysilicon film 305 appears.

Figure 3G:
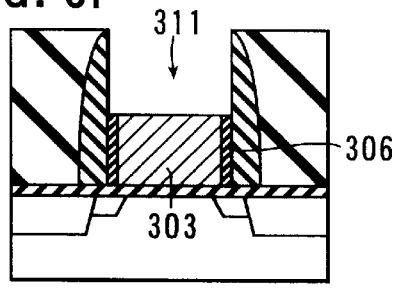

Next, as shown in FIGS. 3G, 4G, the polysilicon film 305 and silicon oxide film 304 which are the dummy layer are removed. More specifically, the polysilicon film 305 is first removed by dry etching. Since the etching selectivity of the polysilicon film against silicon oxide film is 100 or more, only the polysilicon film 305 can be removed with high controllability. After this, the silicon oxide film 304 is removed by use of a diluted hydrofluoric acid solution. The method for removing the silicon oxide film may be the dry etching method. As a result, a groove 311 whose side surface is formed of the silicon nitride film 308 and whose bottom surface is formed of the polysilicon film 303 is formed.

Figure 3H:
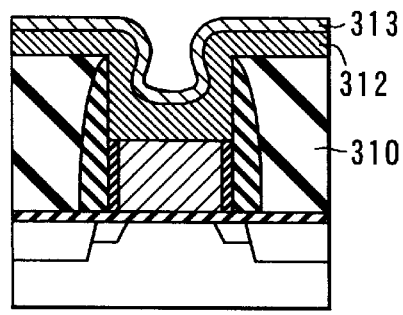

Next, as shown in FIGS. 3H, 4H, for example, a cobalt film (film thickness : 10 nm) 312 is deposited as a metal film on the entire surface by the sputtering method and, for example, a titanium nitride film 313 is formed as an antioxidant film on the cobalt film in order to prevent oxidation of the cobalt film 312 by the remaining oxygen contained in the heating atmosphere.

Figure 3I:
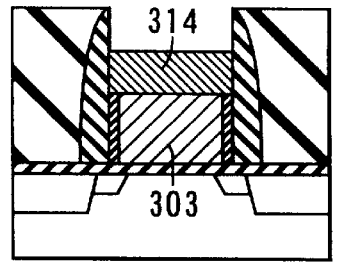

Next, as shown in FIGS. 3I, 4I, for example, the heat treatment is effected at a temperature of 700° C. for 60 seconds to form a cobalt silicide layer 314 on the bottom portion of the groove. Then, for example, the non-reacted cobalt film 312 is selectively removed from the silicide layer 314 by use of a mixture of sulfuric acid and hydrogen peroxide solution. If an antioxidant film is used, it is also removed together with the non-reacted metal film. Further, a heat treatment is effected at a temperature of 850° C. for 30 seconds, for example.

Figure 3J:
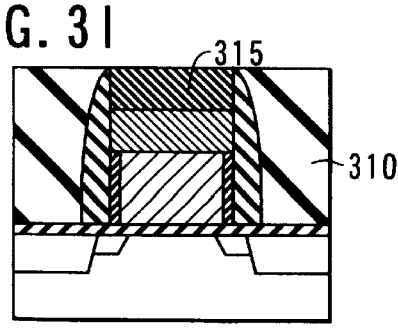
Figure 4J:
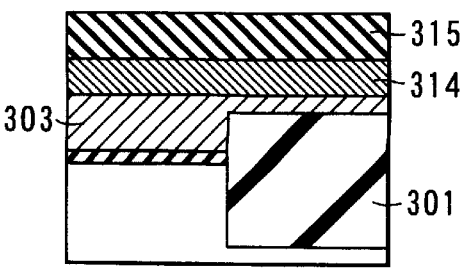

Next, as shown in FIGS. 3J, 4J, a silicon nitride film 315 is deposited on the entire surface by the CVD method and is made flat until the upper surface thereof reaches the surface of the oxide film 310. As a result, a structure in which the upper and side surfaces of the cobalt silicide layer 314 are covered with the silicon nitride films 315 and 308 is obtained and a gate electrode pattern formed of a laminated film of the cobalt silicide film 314 and polysilicon film 303 is formed.

At this time, a small amount of the polysilicon film 303 is left behind on the element isolation region 301 and contributes to alleviation of the stress between the cobalt silicide layer 314 and the element isolation region 301. The gate electrode itself is connected to an adjacent gate electrode via the cobalt silicide layer 314 and no problem occurs on the operation characteristic of the transistor even if the polysilicon film 303 on the element isolation region 301 is thin.

After this, like the first embodiment, a contact is formed by the Self Aligned Contact technique. With the contact forming method, since the silicon nitride films 308 and 315 remain between the gate electrode and the contact, the gate electrode will not be electrically shorted with the contact even if the position of the contact hole pattern is slightly deviated.

As described above, according to this invention, since it is not necessary to process metal silicide by dry etching, low-resistance metal silicide which is difficult to be used in the conventional case can be used to form gate wrirings, gate electrodes or the like, and since the wiring or electrode is covered with the insulating film, the Self Aligned Contact technique can be used.

(Fourth Embodiment)

FIGS. 5A to 5M are cross sectional views for illustrating the manufacturing method in the order of the steps for forming a gate electrode pattern of a MOS field effect transistor.

Figure 5A:
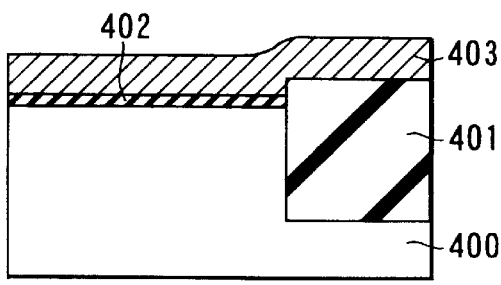
FIGS. 5A to 5M are cross sectional views taken along the gate length direction of a transistor, for illustrating a manufacturing method in the order of the steps for manufacturing a semiconductor device according to a fourth embodiment of this invention.

First, as shown in FIG. 5A, a thin oxide film (film thickness : 5 nm) 402 is formed as a gate insulating film on a semiconductor substrate 400 having an element isolation region 401 formed thereon and a polysilicon film (film thickness : 100 nm) 403 is deposited on the structure by use of the CVD method. After this, P$^+$ ions are doped into the polysilicon film in a condition that the acceration voltage is 10 keV and the dose is $5\times10^{15}$ cm$^{-2}$ and then a heat treatment is performed at a temperature of 800° C. for 30 minutes in a nitrogen atmosphere, for example.

Figure 5E:
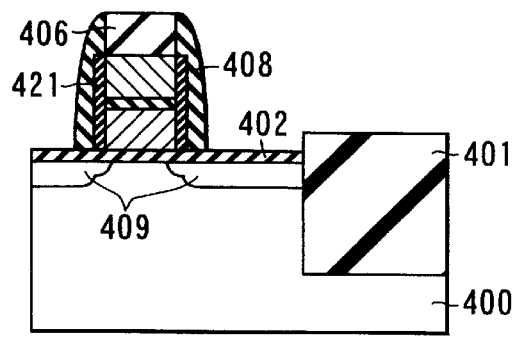
Figure 5B:
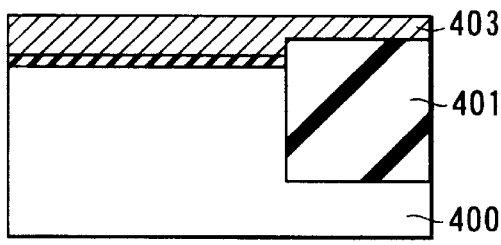

Next, as shown in FIG. 5B, the polysilicon film 403 is polished and made flat by the CMP method by an amount corresponding to a portion of the element isolation region 401 which projects from the semiconductor substrate 400. As the method for making the polysilicon film 403 flat, the etch-back method can be used other than the CMP method. This step is effected to make constant a thickness of a dummy layer to be formed later and if a difference in level is so small as not to give an influence on the dummy layer, this step is not necessarily effected.

Figure 5F:
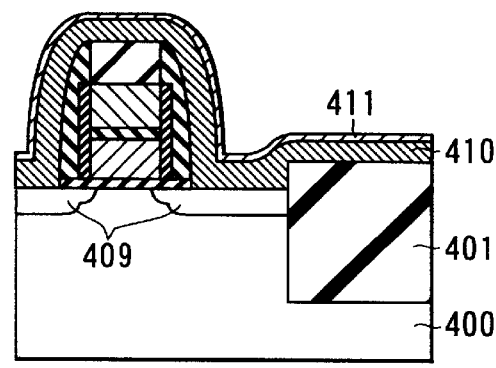
Figure 5C:
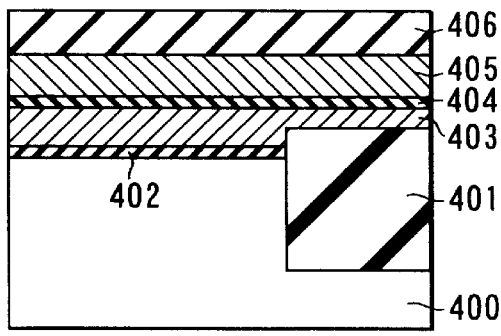

Next, as shown in FIG. 5C, for example, a silicon oxide film (film thickness : 10 nm) 404 and a polysilicon film (film thickness : 100 nm) 405 are formed as a dummy layer to be removed in the groove forming stage.

Figure 5G:
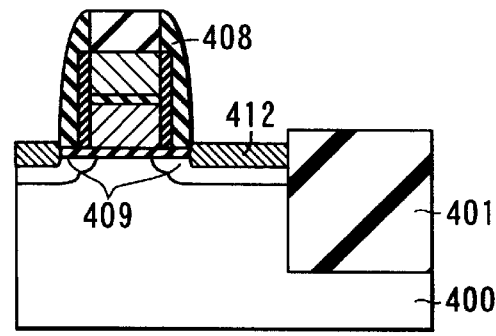
Figure 5D:
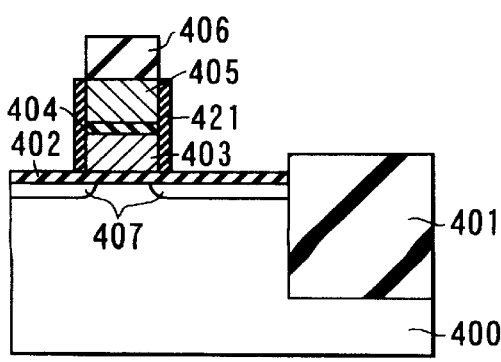

After this, a resist pattern (not shown) is formed on the polysilicon film 405 and then the polysilicon film 403, silicon oxide film 404, polysilicon film 405 and silicon oxide film 406 are etched along the resist pattern by use of a dry etching device as shown in FIG. 5D. The remaining resist pattern is separated by O$_2$ ashing after the etching process.

After this, a post oxidation step is effected for recovering the thin oxide film 402 which is partly removed at the time of etching and rounding a corner portion of the polysilicon film and thus an oxide film 421 is formed. The post oxidation step is effected to further enhance the reliability of the device and is not necessarily effected for all of the devices.

Next, for example, As$^+$ ions are doped into the substrate 400 by the ion-implantation technique in a condition that the acceleration voltage is 30 keV and the dose is $3\times10^{14}$ cm$^{-2}$ so as to form N-type doped layers (source/drain regions) 407.

Then, a silicon nitride film (film thickness 25 nm) 408 is deposited on the entire surface by the CVD method, and as shown in FIG. 5E, the silicon nitride film is etched back by the dry etching method so that the silicon nitride film will be left behind only on the side walls of the polysilicon film 403, silicon oxide film 404, polysilicon film 405 and silicon oxide film 406. Further, for example, As$^+$ ions are doped into the substrate 400 by the ion-implantation technique in a condition that the acceleration voltage is 45 keV and the dose is $3\times10^{15}$ cm$^{-2}$ so as to form N$^+$ doped layers (source/drain regions) 409.

Next, as shown in FIG. 5F, the oxide film 402 lying on the doped layers 409 is removed and then, for example, a cobalt film (film thickness : 10 nm) 410 is deposited as a metal layer on the entire surface by the sputtering method. Further, for example, a titanium nitride film 411 is deposited as an antioxidant film on the cobalt film 410 to prevent oxidation of the cobalt film 410 by the remaining oxygen in the heating atmosphere.

Next, as shown in FIG. 5G, for example, the heat treatment is effected at a temperature of 750° C. for 30 seconds to form cobalt silicide layers 412 on the doped layers 409.

After this, the non-reacted cobalt film 410 is selectively removed from the silicide layer 412 by use of a mixture of sulfuric acid and hydrogen peroxide solution. If the antioxidant film 411 is used, the antioxidant film 411 is also removed together with the non-reacted metal film. Then, for example, the heat treatment is effected at a temperature of 850° C. for 30 seconds to lower the resistance of the silicide film 412.

Figure 5H:
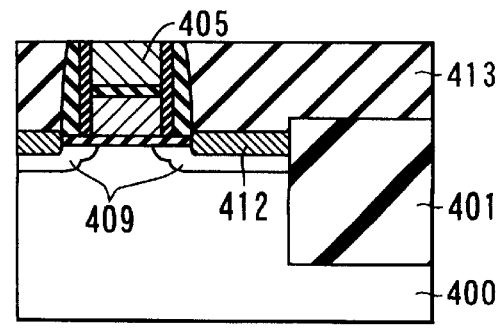

Next, as shown in FIG. 5H, for example, a silicon oxide film (film thickness : 400 nm) 413 is deposited on the structure by the CVD method. Then, the silicon oxide film 413 is made flat until the upper surface of the polysilicon film 405 appears.

Figure 5I:
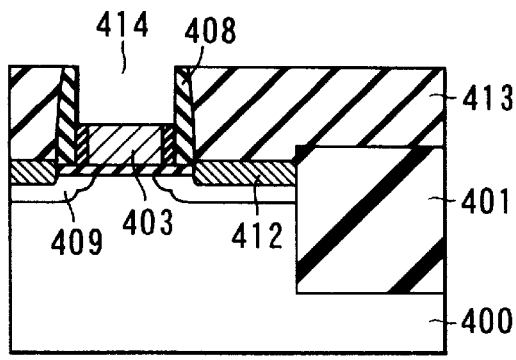

Next, as shown in FIG. 5I, the polysilicon film 405 and silicon oxide film 404 which are the dummy layer are removed. For example, the polysilicon film 405 is removed by dry etching. Since the etching selectivity of the polysilicon film against silicon oxide film is 100 or more, only the polysilicon film 405 can be removed with high controllability. After this, the silicon oxide film 404 on the bottom portion of the groove is removed by use of a diluted hydrofluoric acid solution. The method for removing the silicon oxide film may be the dry etching method. As a result, a groove 414 whose side surface is formed of the silicon nitride film 408 and whose bottom surface is formed of the polysilicon film 403 is formed.

Figure 5L:
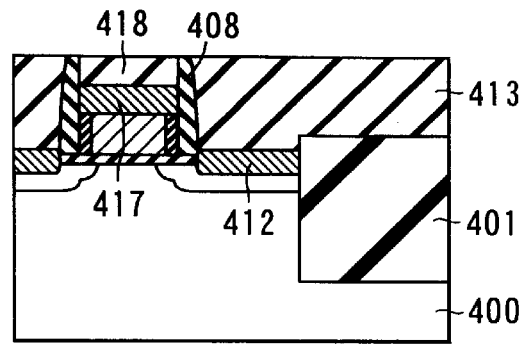
Figure 5J:
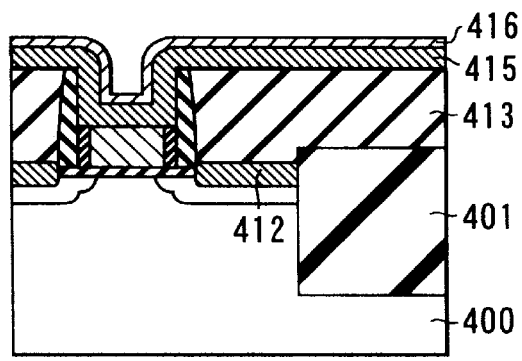

Next, as shown in FIG. 5J, for example, a cobalt film (film thickness : 10 nm) 415 is deposited as a metal layer on the entire surface by the sputtering method. Further, for example, a titanium nitride film 416 is deposited as an antioxidant film on the cobalt film 415 to prevent oxidation of the cobalt film 415 by the remaining oxygen in the heating atmosphere.

Figure 5M:
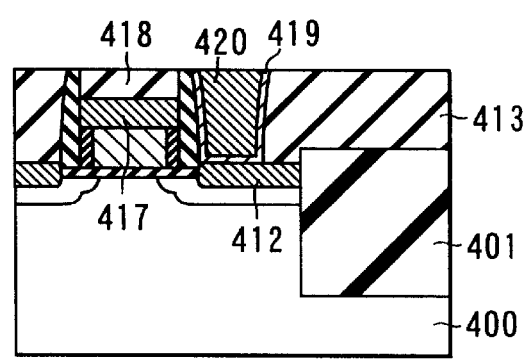
Figure 5K:
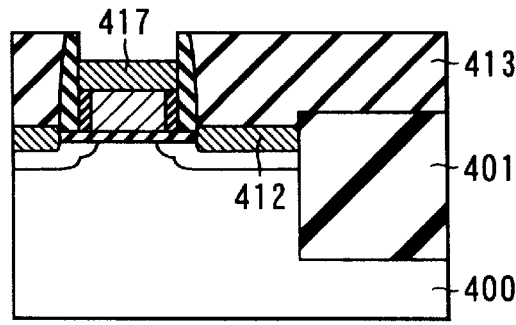

Next, as shown in FIG. 5K, for example, the heat treatment is effected at a temperature of 750° C. for 30 seconds to form a cobalt silicide layer 417 on the bottom portion of the groove. After this, the non-reacted cobalt film 415 is selectively removed from the silicide layer 417 by use of a mixture of sulfuric acid and hydrogen peroxide solution. If the antioxidant film is used, it is also removed together with the non-reacted metal film. Further, a heat treatment is effected at a temperature of 850° C. for 30 seconds, for example.

Next, as shown in FIG. 5L, a silicon nitride film 418 is deposited on the entire surface by the CVD method and is polished and made flat to the height of the surface of oxide film 413. As a result, a structure in which the upper and side surfaces of the cobalt silicide film 417 are covered with the silicon nitride films 418 and 408 is obtained and a gate electrode pattern formed of a laminated film of the cobalt silicide film 417 and polysilicon film 403 is formed.

Next, as shown in FIG. 5M, a contact hole is formed along the silicon nitride film 408 by etching by use of the high etching selectivity of the silicon oxide film 413 against the silicon nitride film 408. Further, a titanium nitride film (film thickness : 10 nm) 419 is deposited on the structure by the sputtering method and then a tungsten film 420 is formed by the CVD method. After this, the titanium nitride film 419 and tungsten film 420 are made flat by the CMP method, for example, until the upper surface of the silicon oxide film 413 appears.

According to this invention, even if the position of the contact hole pattern is slightly deviated to the gate electrode side at the time of forming a contact hole, no electrical short circuit occurs since the silicon nitride film remains between the gate electrode and the contact. Further, as a method for forming the silicide layer on the doped layers, the silicide layer may be formed after an elevation technique for selectively laminating a silicon layer on the doped layer is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

forming a groove portion whose side surface is formed of a first insulating film and whose bottom surface is formed of a silicon film on a main surface of a semiconductor substrate;

forming a metal film on the silicon film of a bottom portion of the groove portion;

reacting the silicon film and the metal film by a heat treatment to selectively form a metal silicide layer on the bottom portion of the groove portion;

removing the metal film other than a portion thereof which has been converted to the metal silicide after the step of reacting the silicon film and the metal film; and forming a second insulating film on the metal silicide layer to form one of a wiring and an electrode which is covered with the first and the second insulating film.

2. The method for manufacturing the semiconductor device according to claim 1, in which the step of forming the groove portion includes a step of forming a third insulating film around the first insulating film and the groove portion whose side surface is formed of the first insulating film and whose bottom surface is formed of the silicon film on the main surface of the semiconductor substrate on which a gate insulating film is formed; and which further comprises the steps of forming a contact hole in the third insulating film in self-alignment with the first and the second insulating film and filling a conductive material in the contact hole after the step of forming the second insulating film.

3. The method for manufacturing the semiconductor device according to claim 1, wherein the metal film is formed of at least one metal whose halide has a melting point or sublimation point of not lower than 300° C.

4. The method for manufacturing the semiconductor device according to claim 1, wherein the metal film is formed of at least one metal selected from a group consisting of cobalt (Co), chrome (Cr), nickel (Ni), magnesium (Mg), hafnium (Hf), rhodium (Rh), palladium (Pd), platinum (Pt), vanadium (V) and zirconium (Zr).

5. The method for manufacturing the semiconductor device according to claim 1, wherein the step of forming the groove portion includes steps of forming the silicon film on the main surface of the semiconductor substrate on which a gate insulating film is formed; processing the silicon film into a desired pattern; forming the first insulating film on a side surface of the silicon film which has been processed into the desired pattern; forming a third insulating film on an entire portion of the main surface of the semiconductor substrate; making the third insulating film flat until an upper surface of the silicon film is exposed; and removing the silicon film by a preset thickness to form the groove portion surrounded by the first insulating film.

6. The method for manufacturing the semiconductor device according to claim 5, further comprising a step of making the silicon film flat between the step of forming the silicon film and the step of processing the silicon film into the desired pattern.

7. The method for manufacturing the semiconductor device according to claim 1, wherein the step of forming the groove portion includes steps of forming the silicon film on the main surface of the semiconductor substrate on which a gate insulating film is formed; forming a dummy film on the silicon film; processing the silicon film and the dummy film into a desired pattern; forming the first insulating, film on side surfaces of the silicon film and the dummy film which have been processed into the desired pattern; forming a third insulating film on the main surface of the semiconductor substrate; making the third insulating film flat until an upper surface of the dummy film is exposed; and removing the dummy film to form the groove portion surrounded by the first insulating film.

8. The method for manufacturing the semiconductor device according to claim 7, further comprising a step of making the silicon film flat between the step of forming the silicon film and the step of forming the dummy film.

9. A method for manufacturing a semiconductor device comprising the steps of:

forming a groove portion whose side surface is formed of a first insulating film and whose bottom surface is formed of a silicon film and a third insulating film lying around the first insulating film on a main surface of a semiconductor substrate on which a gate insulating film is formed;

forming a first metal film on the silicon film of the bottom portion of the groove portion;

reacting the silicon film and the first metal film by a heat treatment to selectively form a first metal silicide layer on the bottom portion of the groove portion;

removing the first metal film other than a portion which has been converted to the first metal silicide layer after the step of reacting the silicon film and the first metal film;

forming a second insulating film on the first metal silicide layer to form one of a wiring and an electrode which is covered with the first and the second insulating film;

forming a contact hole in the third insulating film in self-alignment with the first and the second insulating film; and filling a conductive material in the contact hole.

10. The method for manufacturing the semiconductor device according to claim 9, wherein the metal film is formed of at least one metal whose halide has a melting point or sublimation point of not lower than 300° C.

11. The method for manufacturing the semiconductor device according to claim 10, wherein the metal film is formed of at least one metal selected from a group consisting of cobalt (Co), chrome (Cr), nickel (Ni), magnesium (Mg), hafnium (Hf), rhodium (Rh), palladium (Pd), platinum (Pt), vanadium (V) and zirconium (Zr).

12. The method for manufacturing the semiconductor device according to claim 9, wherein the step of forming the groove portion and the third insulating film includes steps of forming the silicon film on the main surface of the semiconductor substrate on which a gate insulating film is formed; processing the silicon film into a desired pattern; forming the first insulating film on a side surface of the silicon film which has been processed into the desired pattern; forming the third insulating film on an entire portion of the main surface of the semiconductor substrate; making the third insulating film flat until an upper surface of the silicon film is exposed; and removing the silicon film by a preset thickness to form the groove portion surrounded by the first insulating film.

13. The method for manufacturing the semiconductor device according to claim 12, further comprising a step of making the silicon film flat between the step of forming the silicon film and the step of processing the silicon film into the desired pattern.

14. The method for manufacturing the semiconductor device according to claim 9, wherein the step of forming the groove portion and the third insulating film includes steps of forming the silicon film on the main surface of the semiconductor substrate on which a gate insulating film is formed; forming a dummy film on the silicon film; processing the silicon film and the dummy film into a desired pattern; forming the first insulating film on side surfaces of the silicon film, and the dummy film which have been processed into the desired pattern; forming the third insulating film on the main surface of the semiconductor substrate; making the third insulating film flat until an upper surface of the dummy film is exposed; and removing the dummy film to form the groove portion surrounded by the first insulating film.

15. The method for manufacturing the semiconductor device according to claim 14, further comprising a step of making the silicon film flat between the step of forming the silicon film and the step of forming the dummy film.

16. The method for manufacturing the semiconductor device according to claim 9, wherein the step of forming the groove portion and the third insulating film includes steps of forming a laminated layer which is formed by sequentially laminating the silicon film, a fourth insulating film, a dummy film and a fifth insulating film on the main surface of the semiconductor substrate on which the gate insulating film is formed; processing the laminated layer into a desired pattern to form a laminated gate electrode layer; forming a pair of a source and a drain region on the surface of the semiconductor substrate on both sides of the laminated gate electrode layer; forming a sixth insulating film on a side surface of the laminated gate electrode layer; removing portions of the gate insulating film which lie on the source and the drain region and forming second metal films on exposed portions of the source and the drain region; reacting the source and the drain region with the second metal films by a heat treatment to form second metal silicide layers on surfaces of the source and the drain region; removing the second metal film other than a portion which has been converted to the second metal silicide layer after the step of forming the second metal silicide layer; forming the third insulating film on an entire surface of the semiconductor substrate; making the third, the second and the first insulating film flat until an upper surface of the dummy film is exposed; and removing the dummy film.

17. The method for manufacturing the semiconductor device according to claim 16, wherein the contact hole is formed on one of the source and the drain region and the conductive material filling the contact hole is connected to the second metal silicide layer.

* * * * *

UNITED STATES PATENT AND TRADEMARK OFFICE
CERTIFICATE OF CORRECTION

PATENT NO. : 6,235,627 B1
DATED : May 22, 2001
INVENTOR(S) : Kazuaki Nakajima

It is certified that error appears in the above-identified patent and that said Letters Patent is hereby corrected as shown below:

<u>Column 15, claim 7,</u>
Line 15, after "insultaing", delete the comma ",".

<u>Column 16, claim 14,</u>
Line 23, after "silicon film", delete the comma ",".

Signed and Sealed this

Second Day of April, 2002

Attest:

JAMES E. ROGAN
*Director of the United States Patent and Trademark Office*

*Attesting Officer*